(12) United States Patent
Hanaoka

(10) Patent No.: US 9,748,115 B2
(45) Date of Patent: Aug. 29, 2017

(54) ELECTRONIC COMPONENT AND METHOD FOR PRODUCING THE SAME

(71) Applicant: SEIKO EPSON CORPORATION, Tokyo (JP)

(72) Inventor: Terunao Hanaoka, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/939,384

(22) Filed: Nov. 12, 2015

(65) Prior Publication Data

US 2016/0148871 A1     May 26, 2016

(30) Foreign Application Priority Data

Nov. 25, 2014   (JP) ................. 2014-238028

(51) Int. Cl.
| | |
|---|---|
| *H01L 23/528* | (2006.01) |
| *H01L 21/768* | (2006.01) |
| *H01L 21/56* | (2006.01) |
| *H01L 23/31* | (2006.01) |
| *H01L 23/29* | (2006.01) |
| *H01L 23/525* | (2006.01) |
| *H01L 23/532* | (2006.01) |

(52) U.S. Cl.
CPC ............ *H01L 21/56* (2013.01); *H01L 23/293* (2013.01); *H01L 23/3171* (2013.01); *H01L 23/3192* (2013.01); *H01L 23/525* (2013.01); *H01L 23/53295* (2013.01); *H01L 2924/0002* (2013.01)

(58) Field of Classification Search
CPC ............... H01L 23/293; H01L 23/3171; H01L 23/3192; H01L 23/53295; H01L 2924/0002

See application file for complete search history.

(56) References Cited

U.S. PATENT DOCUMENTS

| | | | |
|---|---|---|---|
| 6,720,591 B2 | 4/2004 | Miyamoto et al. | |
| 6,949,416 B2 | 9/2005 | Miyamoto et al. | |
| 7,005,751 B2 | 2/2006 | Khandros et al. | |
| 7,246,432 B2 | 7/2007 | Tanaka et al. | |
| 7,368,375 B2 * | 5/2008 | Brintzinger | H01L 23/49811 257/E23.068 |
| 7,671,476 B2 | 3/2010 | Imai et al. | |
| 7,825,518 B2 | 11/2010 | Imai et al. | |
| 7,936,073 B2 | 5/2011 | Imai et al. | |

(Continued)

FOREIGN PATENT DOCUMENTS

| | | |
|---|---|---|
| JP | 2002-237546 A | 8/2002 |
| JP | 2002-319635 A | 10/2002 |

(Continued)

*Primary Examiner* — Peniel M Gumedzoe
(74) *Attorney, Agent, or Firm* — Oliff PLC

(57) ABSTRACT

An aspect of the invention is an electronic component including a semiconductor substrate 11 that has an electrode pad 12, a first resin layer 14 and a third resin layer 15 that are located above the semiconductor substrate, a second resin layer 16 that is formed such that at least portions of the second resin layer are located on the first resin layer and the third resin layer, a resin projection 17 that includes the first to third resin layers and is higher than the first resin layer, and a wiring layer 24 that is electrically connected to the electrode pad and lies above the resin projection.

8 Claims, 14 Drawing Sheets

(56) References Cited

U.S. PATENT DOCUMENTS

| | | | |
|---|---|---|---|
| 2005/0009340 A1 | 1/2005 | Saijo et al. | |
| 2006/0138677 A1 | 6/2006 | Khandros et al. | |
| 2006/0288572 A1* | 12/2006 | Tanaka | H01L 24/11 29/846 |
| 2008/0023832 A1* | 1/2008 | Chang | H01L 22/32 257/737 |
| 2008/0197505 A1* | 8/2008 | Asakawa | H01L 24/11 257/773 |
| 2008/0284011 A1* | 11/2008 | Chang | H01L 23/49811 257/737 |

FOREIGN PATENT DOCUMENTS

| | | |
|---|---|---|
| JP | 3669460 B2 | 7/2005 |
| JP | 2005-340255 A | 12/2005 |
| JP | 2006-525672 A | 11/2006 |
| JP | 2007-012678 A | 1/2007 |
| JP | 2007-012813 A | 1/2007 |
| JP | 2007-305723 A | 11/2007 |
| JP | 4245996 B2 | 4/2009 |
| JP | 4508064 B2 | 7/2010 |
| JP | 4543460 B2 | 9/2010 |
| WO | 2004-093164 A2 | 10/2004 |

* cited by examiner

Cross-sectional view (X-X')

Cross-sectional view (Y-Y')

Cross-sectional view (X-X')

Cross-sectional view (Y-Y')

Cross-sectional view (X-X')

Cross-sectional view (Y-Y')

Cross-sectional view (X-X')

Cross-sectional view (Y-Y')

Cross-sectional view (X-X')

Cross-sectional view (Y-Y')

Cross-sectional view (X-X')

Cross-sectional view (Y-Y')

ELECTRONIC COMPONENT AND METHOD FOR PRODUCING THE SAME

BACKGROUND

1. Technical Field

The present invention relates to an electronic component and a method for producing the same.

2. Related Art

A method for producing an electronic component in related art will be described with reference to FIGS. 12A to 12D, 13A to 13D, and 14. FIGS. 12A to 12D, 13A to 13D, and 14 are cross-sectional views illustrating the method for producing an electronic component in related art.

As shown in FIG. 12A, an electrode pad 111 is formed on a semiconductor substrate 101, and a passivation film 112 is formed on the entire surface including the electrode pad 111. Then, an opening portion that is located on the electrode pad 111 is formed in the passivation film 112.

Next, as shown in FIG. 12B, a photosensitive polyimide film is provided above the semiconductor substrate 101 having the electrode pad 111 and the passivation film 112, and is exposed and developed. Thus, a resin layer 113 constituted by the polyimide film is formed on the passivation film 112. Then, as shown in FIG. 12C, a resin projection (core resin) 102 is formed above the semiconductor substrate 101 by curing the resin layer 113.

Thereafter, as shown in FIG. 12D, a TiW layer 114 (or a laminated film of a TiW layer and a Ti layer) is formed on the electrode pad 111, the passivation film 112 and the core resin 102 by sputtering. Then, an Au layer 115 is formed on the TiW layer 114 by sputtering.

Next, as shown in FIG. 13A, a photoresist film is provided on the Au layer 115, and is exposed and developed, thus a resist pattern 116 is formed on the Au layer. Then, as shown in FIG. 13B, wet etching is performed on the Au layer 115 using the resist pattern 116 as a mask.

Next, as shown in FIG. 13C, the resist pattern 116 is removed. Then, as shown in FIG. 13D, a wiring layer 103 including the TiW layer 114 and the Au layer 115 is formed by etching the TiW layer 114 using the Au layer 115 as a mask. This wiring layer 103 is electrically connected to the electrode pad 111, and lies above the core resin 102 (see JP-A-2007-12678, for example).

Next, as shown in FIG. 14, a mounting substrate 104 is prepared that includes an electrode (joining target electrode 106) to be joined to the wiring layer 103 lying above the core resin 102 of the semiconductor substrate 101. Then, the semiconductor substrate 101 and the mounting substrate 104 are aligned such that the wiring layer 103 on the core resin 102 and the joining target electrode 106 are opposed to each other. Next, the wiring layer 103 on the core resin 102 is joined to the joining target electrode 106 by applying loads to the semiconductor substrate 101 and the mounting substrate 104. Accordingly, the semiconductor substrate 101 is mounted on the mounting substrate 104.

Incidentally, at least one of the semiconductor substrate 101 and the mounting substrate 104 may be warped. In particular, the thinner the semiconductor substrate 101 and the mounting substrate 104 are, the more likely they are to be warped. If warping occurs in this manner, the distance between the wiring layer 103 on the core resin 102 and the joining target electrode 106 varies. Therefore, it is necessary to increase the height of the core resin 102 in order to realize highly reliable joining.

Meanwhile, the core resin 102 is formed so as to have a height of 13 to 14 µm, in general, and the upper limit of the thickness of the core resin 102 is about 24 to 25 µm. This is because there is a limitation on the maximum thickness due to the properties (viscosity, resolution) of polyimide to be used in the single-layer core resin 102.

When the thickness of the core resin 102 is increased, a step is formed between the core resin 102 and the passivation film 112, which is an underlying film of the core resin 102. Therefore, when forming the wiring layer 103, such as Au wiring, lying above the core resin 102, the thickness of the photoresist film for covering the step of the thick core resin 102 also needs to be increased, and accordingly high coverage properties are required. If the coverage properties are poor, the reliability of the resist pattern after the development will be deteriorated, and as a result, the reliability of the wiring layer 103 will be deteriorated. Accordingly, the wiring layer 103 may be broken at a step portion 105 of the core resin 102 due to stress generated during mounting.

JP-A-2007-12678 is an example of related art.

SUMMARY

Some aspects of the invention are directed to an electronic component in which a conductive layer that lies above a resin projection can be joined to a joining target electrode even when the distance therebetween varies, and a method for producing the electronic component.

An aspect of the invention is an electronic component including a substrate that has an electrode, a first resin layer that is located above the substrate, a second resin layer that is formed such that at least a portion of the second resin layer is located on the first resin layer, a resin projection that includes the first and second resin layers and is higher than the first resin layer, and a conductive layer that is electrically connected to the electrode and lies above the resin projection.

With the above-described aspect of the invention, the resin projection includes the first resin layer located above the substrate and the second resin layer formed such that at least a portion of the second resin layer is located on the first resin layer, and thus the height of the resin projection can be increased. Therefore, the conductive layer lying above the resin projection can be joined to the joining target electrode even when the distance therebetween varies.

In the above-described aspect of the invention, an aspect of the invention is an electronic component including a third resin layer that is located above the substrate and next to the first resin layer. At least a portion of the second resin layer is located on the third resin layer, and the resin projection includes the third resin layer and is higher than the third resin layer. This makes it possible to increase the height of the resin projection.

In the above-described aspect of the invention, an aspect of the invention is an electronic component in which the first resin layer has the same width as that of the third resin layer. This makes it possible to process the first and third resin layers in a single step of a photolithography process.

In the above-described aspect of the invention, an aspect of the invention is an electronic component in which a length from a side portion of the first resin layer to a side portion of the third resin layer located under the conductive layer is larger than a width of the second resin layer located under the conductive layer. This makes it possible to form steps generated by the resin projection into a stair shape. Therefore, it is possible to improve the coverage property of the photoresist film in the photolithography process.

In the above-described aspect of the invention, an aspect of the invention is an electronic component including an insulating layer that is located between the substrate and the first and third resin layers and is in contact with the first and third resin layers. A portion of the second resin layer that is located between the first resin layer and the third resin layer is in contact with the insulating layer.

With the above-described aspect of the invention, since a portion of the second resin layer is in contact with the insulating layer, it is possible to improve the adhesion between the resin projection and the insulating layer compared with a case where the first and third resin layers are in contact with the insulating layer and the second resin layer is not in contact with the insulating layer.

In the above-described aspect of the invention, an aspect of the invention is an electronic component in which a height of the second resin layer from the highest portion of the first resin layer is larger than a height of the first resin layer. Accordingly, the second resin layer can exhibit greater cushioning properties when the conductive layer lying above the resin projection is joined to the joining target electrode.

In the above-described aspect of the invention, an aspect of the invention is an electronic component in which the substrate has a plurality of the electrodes, a plurality of the conductive layers lie above the resin projection, and the plurality of conductive layers are electrically connected to the plurality of electrodes, respectively.

With the above-described aspect of the invention, since the resin projection is higher, the conductive layers lying above the resin projection can be reliably joined to the joining target electrodes, respectively, even when the distances therebetween vary.

In the above-described aspect of the invention, an aspect of the invention is an electronic component in which the substrate is a semiconductor substrate.

In the above-described aspect of the invention, an aspect of the invention is an electronic component in which the conductive layer on the resin projection is to be joined to an electrode of a mounting substrate.

An aspect of the invention is a method for producing an electronic component including forming a first resin layer above a substrate having an electrode, curing the first resin layer, forming a second resin layer such that at least a portion of the second resin layer is located on the first resin layer, forming a resin projection that includes the first and second resin layers and is higher than the first resin layer by curing the second resin layer, and forming a conductive layer that is electrically connected to the electrode and lies above the resin projection.

With the above-described aspect of the invention, since the resin projection, which includes the first and second resin layers and is higher than the first resin layer, is formed, the conductive layer lying above the resin projection can be joined to the joining target electrode even when the distance therebetween varies.

An aspect of the invention is a method for producing an electronic component including forming, above a substrate having an electrode, a first resin layer and a third resin layer that is located next to the first resin layer, curing the first and third resin layers, forming a second resin layer such that at least portions of the second resin layer are located on the first and third resin layers, forming a resin projection that includes the first, second and third resin layers and is higher than the first resin layer and is higher than the third resin layer by curing the second resin layer, and forming a conductive layer that is electrically connected to the electrode and lies above the resin projection.

With the above-described aspect of the invention, the resin projection, which includes the first, second and third resin layers and is higher than the first resin layer and is higher than the third resin layer, is formed. Therefore, the conductive layer lying above the resin projection can be joined to the joining target electrode even when the distance therebetween varies.

In the above-described aspect of the invention, an aspect of the invention is a method for producing an electronic component in which the first resin layer has the same width as that of the third resin layer. This makes it possible to process the first and third resin layers in a single step of the photolithography process.

In the above-described aspect of the invention, an aspect of the invention is a method for producing an electronic component in which a length from a side portion of the first resin layer to a side portion of the third resin layer located under the conductive layer is larger than a width of the second resin layer located under the conductive layer. This makes it possible to form steps generated by the resin projection into a stair shape. Therefore, it is possible to improve the coverage property of the photoresist film in the photolithography process.

In the above-described aspect of the invention, an aspect of the invention is a method for producing an electronic component including forming a resist pattern on the conductive layer by providing a photoresist film on the conductive layer and by exposing and developing the photoresist film after forming the conductive layer, and etching the conductive layer using the resist pattern as a mask.

With the above-described aspect of the invention, since steps generated by the resin projection can be formed into a stair shape, it is possible to improve the coverage property of the photoresist film when the photoresist film is provided on the conductive layer.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the accompanying drawings. However, the invention is not limited to the following description, and it can be easily understood by a person skilled in the art that various changes may be made in the form and the details of the invention without departing from the spirit and scope of the invention. Therefore, the invention is not to be construed as being limited to the following description of the embodiments.

First Embodiment

Figure 1A:
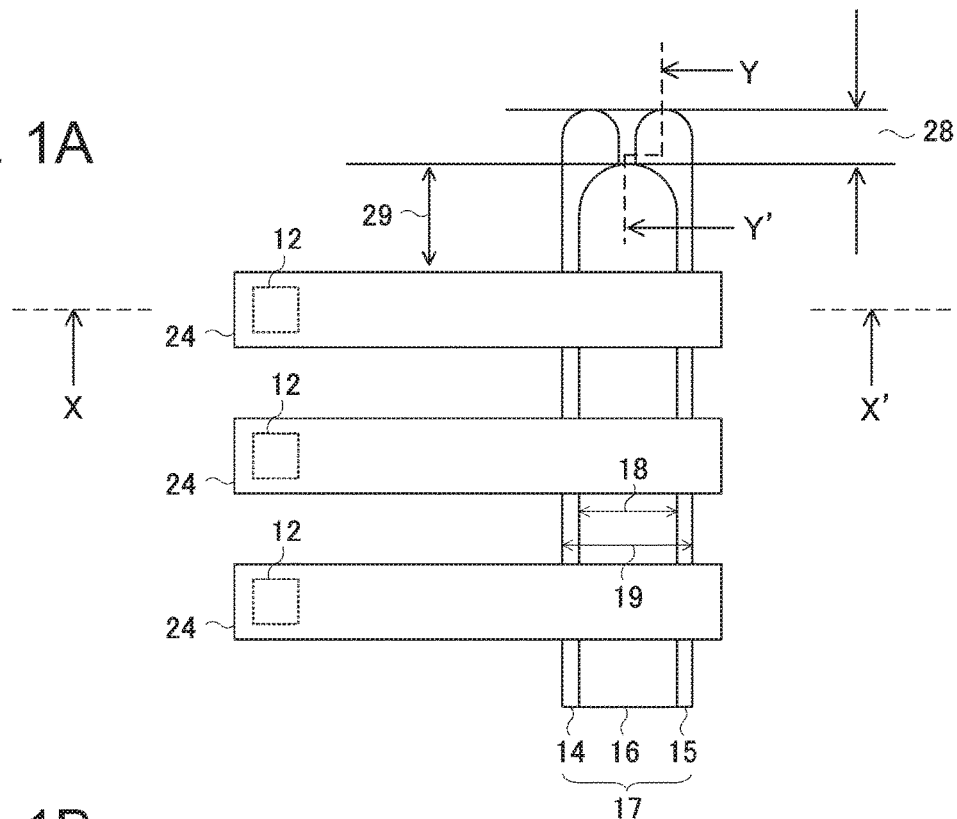
FIG. 1A is a plan view of an electronic component according to an aspect of the invention.
Figure 1B:
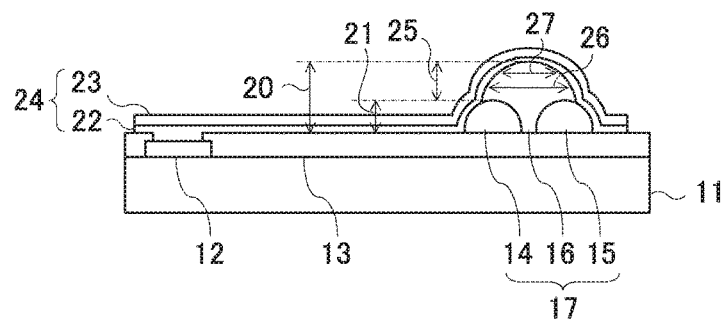
FIG. 1B is a cross-sectional view taken along line X-X' in FIG. 1A.
Figure 1C:
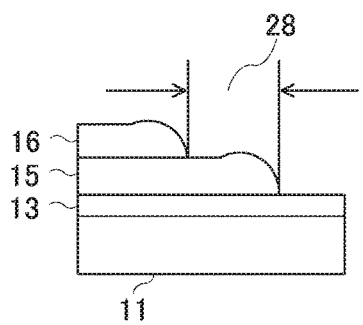
FIG. 1C is a cross-sectional view taken along line Y-Y' in FIG. 1A.
Figure 2:
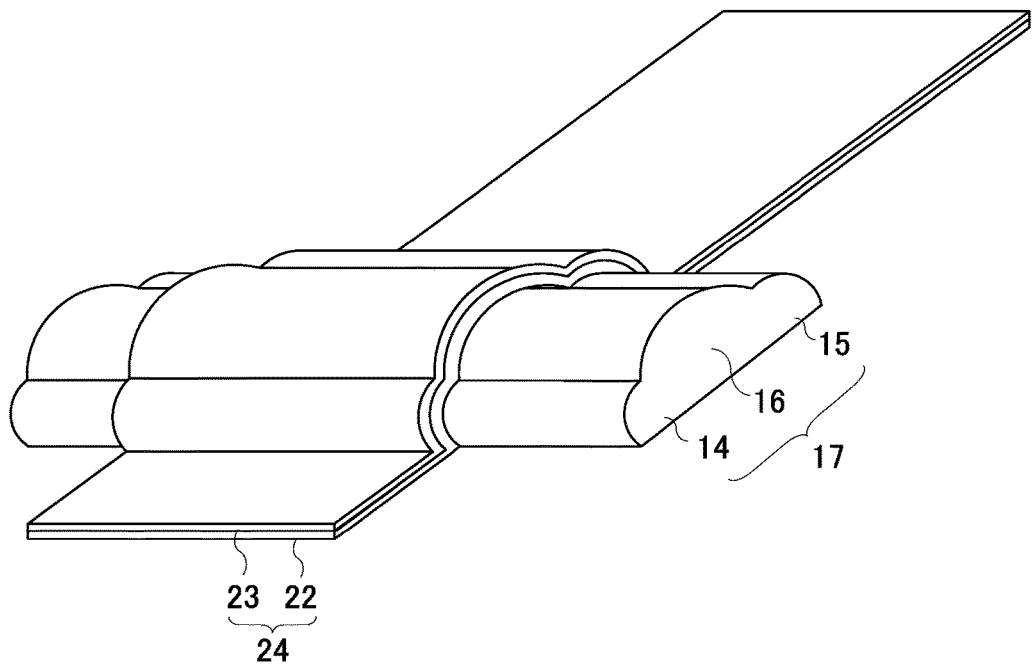
FIG. 2 is a perspective view showing a core resin and a wiring layer shown in FIGS. 1A to 1C.

FIG. 1A is a plan view of an electronic component according to an aspect of the invention, FIG. 1B is a cross-sectional view taken along line X-X' in FIG. 1A, and FIG. 1C is a cross-sectional view taken along line Y-Y' in FIG. 1A. FIG. 2 is a perspective view showing a core resin and a wiring layer shown in FIGS. 1A to 1C.

As shown in FIGS. 1A to 1C, a semiconductor substrate 11 as a substrate is provided with a semiconductor element (not shown) such as a transistor, wiring and the like (not shown). It should be noted that a semiconductor wafer such as a silicon wafer or a semiconductor chip such as a silicon chip may be used as the semiconductor substrate 11. Moreover, a glass substrate or a ceramics substrate may be used as the substrate.

Electrode pads 12 are formed on the semiconductor substrate 11. A passivation film (insulating layer) 13 is formed on the electrode pads 12 and the semiconductor substrate 11, and opening portions that are located on the electrode pads 12 are formed in the passivation film 13.

A first core resin (also referred to as "first resin layer") 14 and a second core resin (also referred to as "third resin layer") 15 are formed on the passivation film 13. The first core resin 14 and the second core resin 15 are each formed in a linear shape as shown in FIG. 1A, and the first core resin 14 and the second core resin 15 are disposed to be apart from each other and are not in contact with each other (see FIG. 1B).

A third core resin (also referred to as "second resin layer") 16 is formed on the first and second core resins 14 and 15, and a portion of the third core resin 16 is in contact with the passivation film 13. That is, a portion of the third core resin 16 is in contact with the first core resin 14, a portion of the third core resin 16 is in contact with the second core resin 15, and a portion of the third core resin 16 is in contact with the passivation film 13. Thus, a resin projection 17 including the first to third core resins 14, 15 and 16 is formed.

Bringing the third core resin 16 into contact with the passivation film 13 makes it possible to increase the adhesion strength compared with a case where the first and second core resins 14 and 15 are in contact with the passivation film 13 and the third core resin 16 is not in contact with the passivation film 13.

A TiW layer 22 (or a laminated film of a TiW layer 22 and a Ti layer (not shown)) is formed on the resin projection 17, the passivation film 13 and the electrode pads 12, and an Au layer 23 is formed on the TiW layer 22. The Au layer 23 and the TiW layer 22 make up a plurality of wiring layers 24. The wiring layers 24 are electrically connected to the electrode pads 12, and lie above the resin projection 17 (see FIGS. 1A, 1B and 2).

It is preferable that the first core resin 14 has the same width as that of the second core resin 15. This makes it possible to form the first and second core resins 14 and 15 in a single step of a photolithography process, which will be described later. Accordingly, the production process can be simplified. In other words, if the width of the first core resin 14 is different from that of the second core resin 15, the first core resin 14 and the second core resin 15 need to be formed separately, and therefore, the photolithography process needs to be performed in two steps.

A length 19 from a side portion of the first core resin 14 to a side portion of the second core resin 15 is larger than a width 18 of the third core resin 16 (see FIG. 1A). This makes it possible to make steps generated by the resin projection 17 smaller. Furthermore, a width 27 is smaller than a width 26 in the third core resin 16 (see FIG. 1B). This makes it possible to make steps generated by the resin projection 17 smaller. As a result, it is possible to improve the coverage property of a photoresist film in the photolithography process for forming the wiring layers 24, which will be described later, and to reduce the concentration of stress during mounting, which will be described later. That is, it is possible to distribute the stress generated during mounting compared with an electronic component in related art.

As shown in FIG. 1B, a height 20 of the resin projection 17 is larger than a height 21 of each of the first core resin 14 and the second core resin 15. In addition, a height 25 of the third core resin 16 from the highest portions of the first and second core resins 14 and 15 is larger than the height 21 of each of the first and second core resins 14 and 15. The height 25 is preferably 1.5 times or higher than the height 21, and more preferably twice or higher than the height 21. Thus, the third core resin 16 can exhibit greater cushioning properties during mounting, which will be described later.

In the case where polyimide is used in the first to third core resins 14, 15 and 16, it is preferable that an end portion of the third core resin 16 and an end portion of each of the first and second core resins 14 and 15 are spaced apart with an interval 28 of 50 μm or more. The polyimide end portion swells due to cure shrinkage after curing, and therefore, when the end portions are spaced apart from each other by 50 μm or more, it is possible to suppress an excessive increase in the height of the end portions (see FIGS. 1A and 1C).

Furthermore, when polyimide is used in the third core resin 16, it is preferable that the end portion of the third core resin 16 and the wiring layer 24 are spaced apart with an interval 29 of 50 μm or more. This is for the purpose of preventing the wiring layer 24 from being formed on the swelled portion because the polyimide end portion swells due to cure shrinkage after curing. If the wiring layer 24 is formed on the swelled portion, the coverage property of the photoresist film is deteriorated in the photolithography process for forming the wiring layers 24, which will be described later (see FIGS. 1A and 1C).

FIGS. 3A to 3E and 4A to 4E are cross-sectional views illustrating a method for producing the electronic component shown in FIGS. 1A to 1C.

Figure 3A:
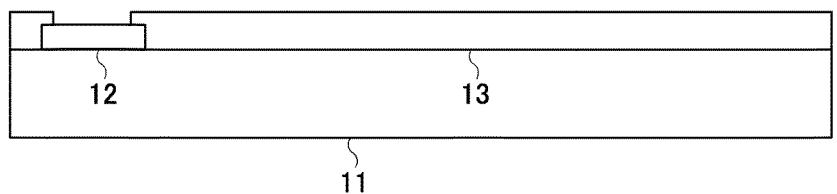
FIGS. 3A to 3E are cross-sectional views illustrating a method for producing the electronic component shown in FIGS. 1A to 1C.

As shown in FIG. 3A, the electrode pads 12 are formed on the semiconductor substrate 11, and the passivation film 13 is formed on the entire surface including these electrode pads 12. Then, opening portions that are located on the electrode pads 12 are formed in the passivation film 13.

Figure 3B:
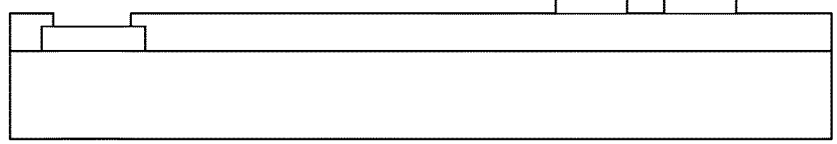

Next, as shown in FIG. 3B, a photosensitive polyimide film is provided above the semiconductor substrate 11 having the electrode pads 12 and the passivation film 13, and is exposed and developed. Thus, resin layers 14a and 15a constituted by the polyimide film are formed on the passivation film 13. The resin layers 14a and 15a have a quadrangular cross section.

Figure 3C:
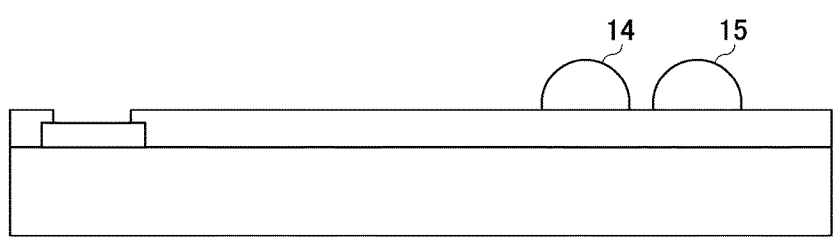

Then, the first and second core resins 14 and 15 are formed above the semiconductor substrate 11 as shown in FIG. 3C by curing the resin layers 14a and 15a. The first and second core resins 14 and 15 each have a nearly semicircular cross section.

Figure 3D:
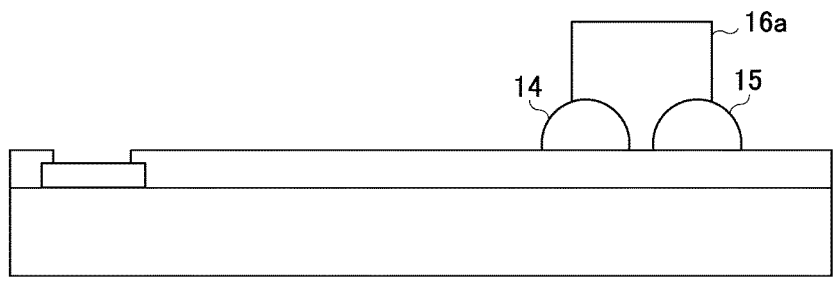

Next, as shown in FIG. 3D, a photosensitive polyimide film is provided on the entire surface including the first and second core resins 14 and 15, and is exposed and developed. Thus, a resin layer 16a constituted by the polyimide film is formed on the first and second core resins 14 and 15. The resin layer 16a has a quadrangular cross section.

Figure 3E:
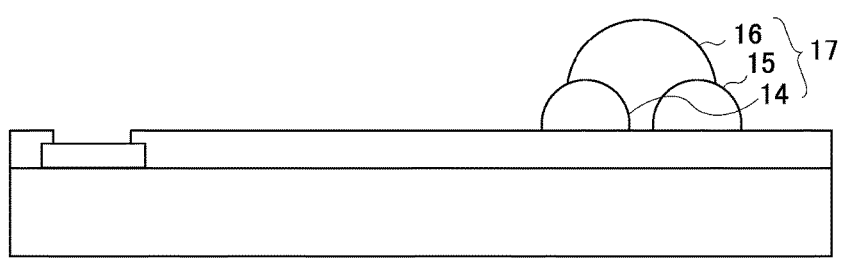

Then, the third core resin 16 is formed on the first and second core resins 14 and 15 as shown in FIG. 3E by curing the resin layer 16a. The third core resin 16 has a nearly semicircular cross section. In this manner, the resin projection 17 including the first to third core resins 14, 15 and 16 is formed.

Figure 4A:
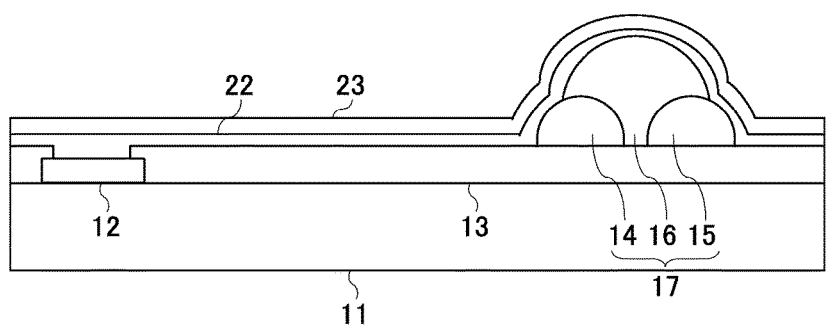
FIGS. 4A to 4E are cross-sectional views illustrating a method for producing the electronic component shown in FIGS. 1A to 1C.

Thereafter, as shown in FIG. 4A, the TiW layer 22 (or a laminated film of the TiW layer 22 and a Ti layer (not shown)) is formed on the electrode pads 12, the passivation film 13 and the first to third core resins 14, 15 and 16 by sputtering. Then, the Au layer 23 is formed on the TiW layer 22 by sputtering.

Figure 4B:
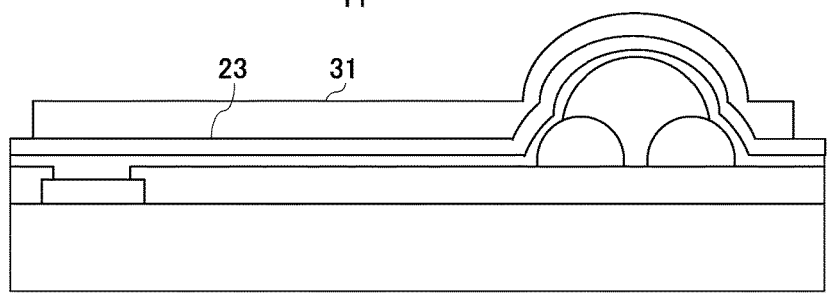
Figure 4C:
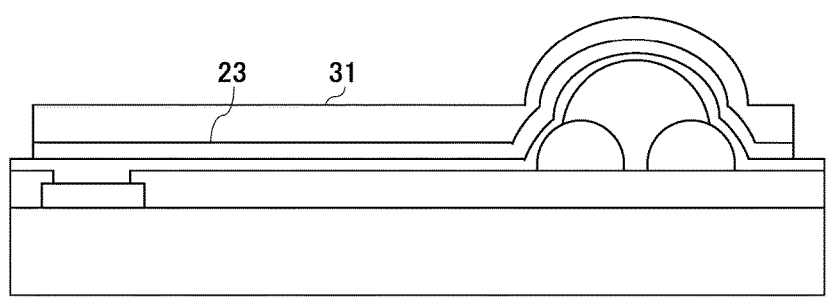

Next, as shown in FIG. 4B, a photoresist film is provided on the Au layer 23, and is exposed and developed, thus a resist pattern 31 is formed on the Au layer 23. Then, as shown in FIG. 4C, wet etching is performed on the Au layer 23 using the resist pattern 31 as a mask.

Figure 4D:
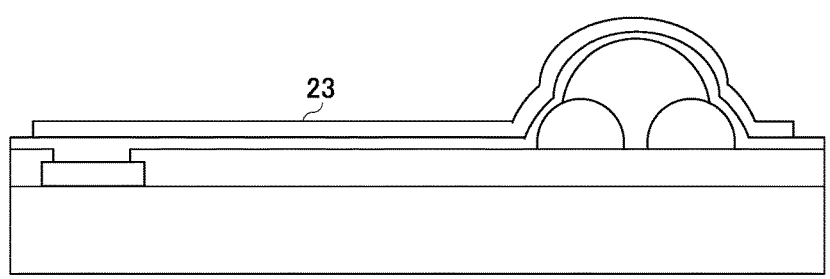
Figure 4E:
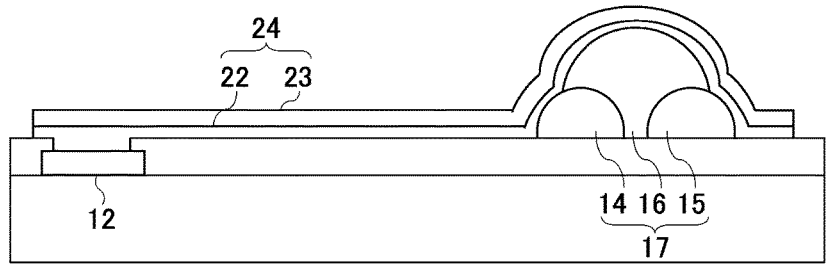

Next, as shown in FIG. 4D, the resist pattern 31 is removed. Then, as shown in FIG. 4E, the wiring layers 24 including the TiW layer 22 and the Au layer 23 are formed by etching the TiW layer 22 using the Au layer 23 as a mask. These wiring layers 24 are electrically connected to the electrode pads 12, and lie above the resin projection 17.

Figure 5:
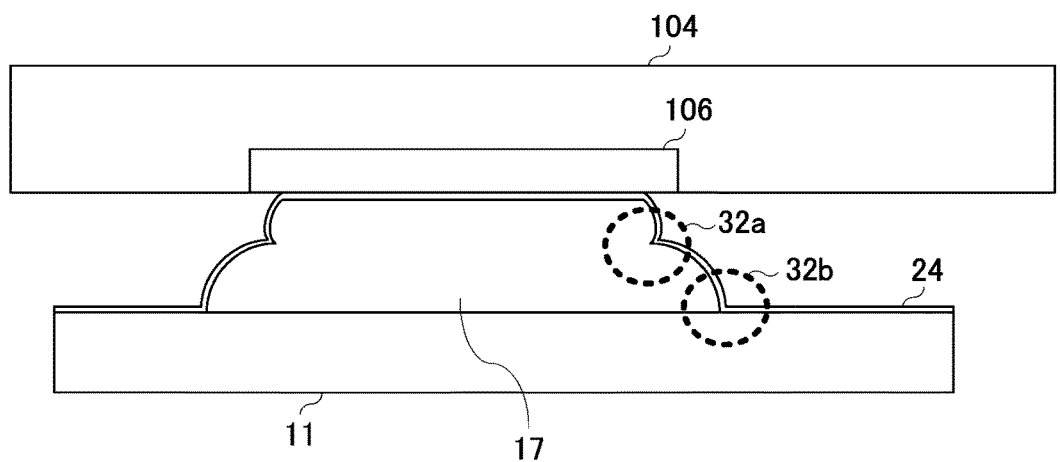
FIG. 5 is a partial cross-sectional view showing a state in which an electronic component according to an aspect of the invention is mounted on a substrate.

Next, as shown in FIG. 5, the mounting substrate 104 is prepared that includes an electrode (joining target electrode 106) to be joined to the wiring layer 24 lying above the resin projection 17 of the semiconductor substrate 11. Then, the semiconductor substrate 11 and the mounting substrate 104 are aligned such that the wiring layer 24 on the resin projection 17 and the joining target electrode 106 are opposed to each other. Then, the wiring layer 24 on the resin projection 17 is joined to the joining target electrode 106 by bonding by applying a load to the semiconductor substrate 11 and the mounting substrate 104. Accordingly, the semiconductor substrate 11 is mounted on the mounting substrate 104.

With this embodiment, the height of the resin projection 17 can be increased by forming the third core resin 16 on the first and second core resins 14 and 15. For example, the height of the resin projection 17 can be increased by about 2 to 10 μm compared with that in related art, thus enabling the resin projection 17 having a height of about 30 μm to be formed. Therefore, even if at least one of the semiconductor substrate 11 and the mounting substrate 104 is warped and the distance between the wiring layer 24 on the resin projection 17 and the joining target electrode 106 varies, it is possible to realize highly reliable joining.

In this embodiment, since the resin projection 17 is formed in a stair shape using the first to third core resins 14, 15 and 16, it is possible to make steps generated by the resin projection 17 small even when the height of the resin projection 17 is increased. This makes it possible to improve the coverage property of the photoresist film in the photolithography process for forming the wiring layers 24 on the resin projection 17. As a result, it is possible to improve the reliability of the wiring layers 24. This makes it possible to lessen the chance of a case where the wiring layers 24 are broken in step portions 32a and 32b of the resin projection 17 due to the concentration of stress during mounting.

As described above, since the coverage property of the photoresist film can be improved in the photolithography process for forming the wiring layers 24, it is possible to minimize the wiring layers 24.

In this embodiment, since the resin projection 17 is formed in a stair shape using the first to third core resins 14, 15 and 16, it is possible to distribute the stress generated during mounting in the step portions 32a and 32b of the resin projection 17. It is possible to lessen the chance of a case where the wiring layers 24 are broken during mounting by reducing the concentration of stress during mounting in this manner. As a result, it is possible to improve the reliability of the wiring layers 24.

It should be noted that although the first to third core resins 14, 15 and 16 are formed using the polyimide film in this embodiment, the first to third core resins 14, 15 and 16 can also be formed using another type of resin.

Second Embodiment

Figure 6A:
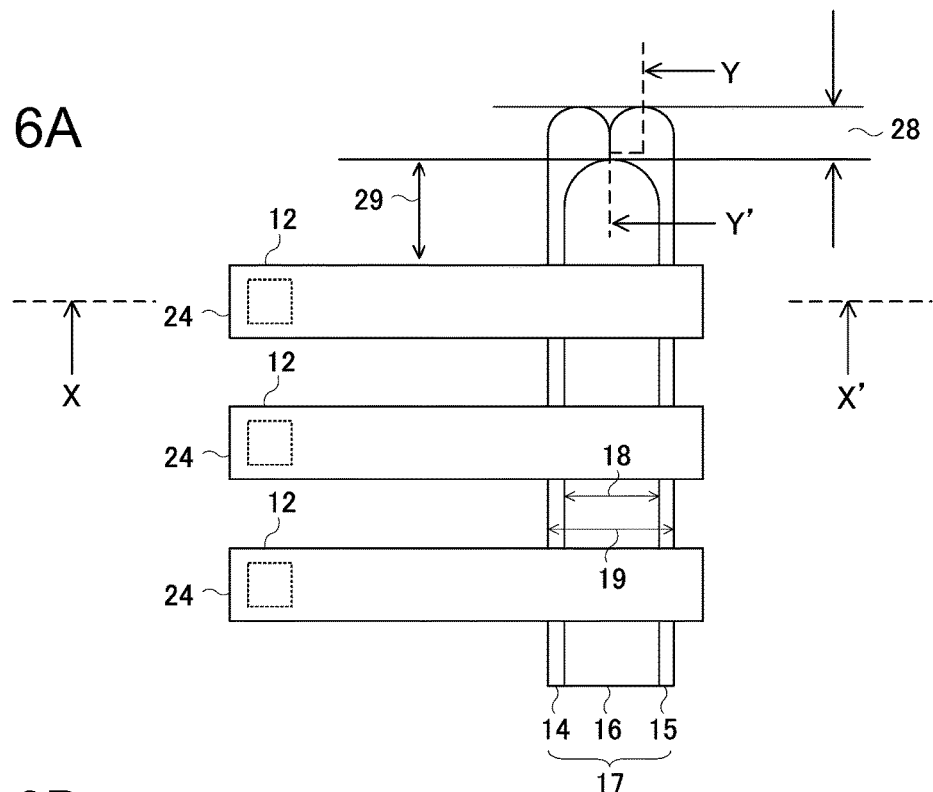
FIG. 6A is a plan view of an electronic component according to an aspect of the invention.
Figure 6B:
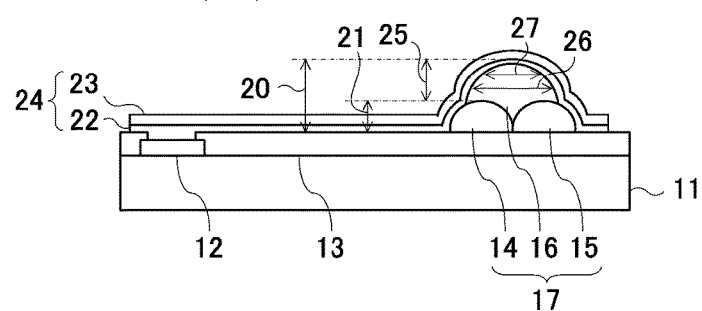
FIG. 6B is a cross-sectional view taken along line X-X' in FIG. 6A.
Figure 6C:
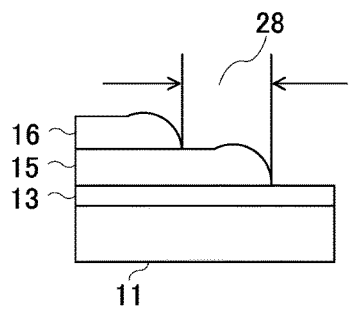
FIG. 6C is a cross-sectional view taken along line Y-Y' in FIG. 6A.

FIGS. 6A to 6C are plan views illustrating an electronic component according to an aspect of the invention. The same portions as those shown in FIGS. 1A to 1C are denoted by the same reference numerals, and different portions will be described.

The first core resin 14 and the second core resin 15, which are formed in a linear shape shown in FIGS. 1A and 1B, are disposed so as to be apart from each other and are not in contact with each other, whereas, in this embodiment, the first core resin 14 and the second core resin 15 are disposed so as to be in contact with each other as shown in FIGS. 6A and 6B.

This embodiment can also provide the same effects as those of the first embodiment.

In addition, in this embodiment, since the first core resin 14 and the second core resin 15 are disposed so as to be in contact with each other, the resin projection 17 can be made higher than that in the first embodiment.

Third Embodiment

Figure 7A:
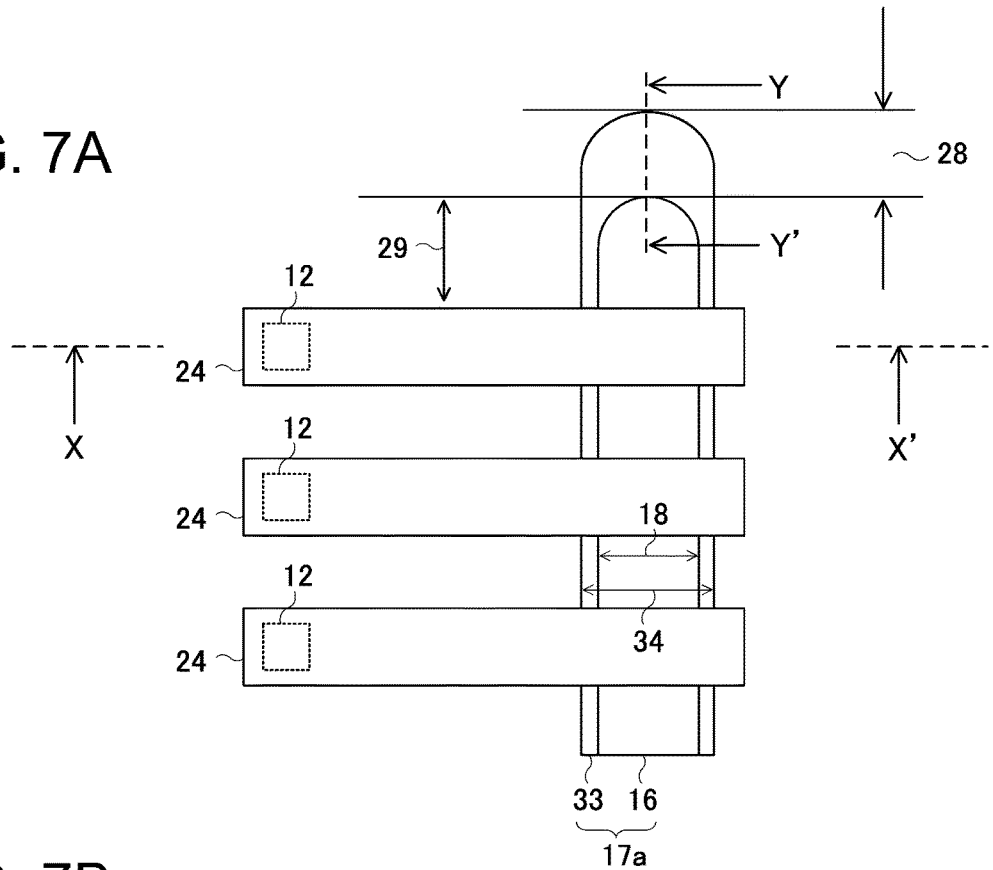
FIG. 7A is a plan view of an electronic component according to an aspect of the invention.
Figure 7B:
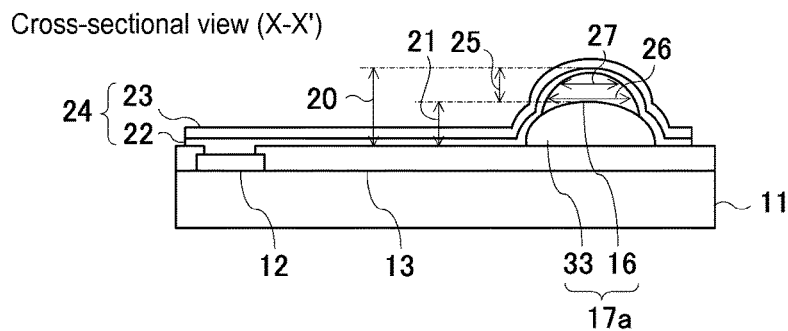
FIG. 7B is a cross-sectional view taken along line X-X' in FIG. 7A.
Figure 7C:
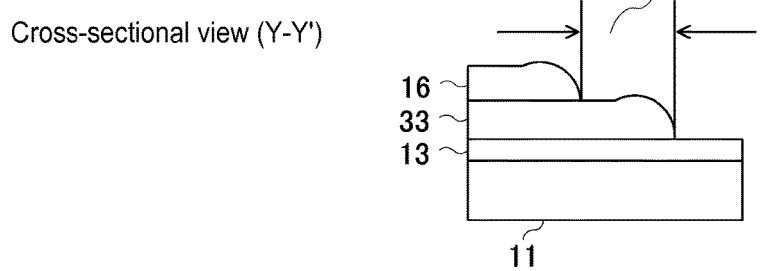
FIG. 7C is a cross-sectional view taken along line Y-Y' in FIG. 7A.

FIGS. 7A to 7C are plan views illustrating an electronic component according to an aspect of the invention. The same portions as those shown in FIGS. 1A to 1C are denoted by the same reference numerals, and different portions will be described.

A first core resin (also referred to as "first resin layer") 33 is formed on the passivation film 13. The first core resin 33 is formed in a linear shape as shown in FIG. 7A.

The third core resin 16 is formed on the first core resin 33, and is not in contact with the passivation film 13. A resin projection 17a including the first and third core resins 33 and 16 is formed in this manner.

The TiW layer 22 is formed on the resin projection 17a, the passivation film 13 and the electrode pad 12, and the Au layer 23 is formed on the TiW layer 22. The Au layer 23 and the TiW layer 22 make up a plurality of wiring layers 24. The wiring layers 24 are electrically connected to the electrode pad 12, and lie above the resin projection 17a (see FIGS. 7A and 7B).

A width 34 of the first core resin 33 is larger than the width 18 of the third core resin 16 (see FIG. 7A). This makes it possible to make steps generated by the resin projection 17a smaller.

In the case where polyimide is used in the first and third core resins 33 and 16, it is preferable that an end portion of the third core resin 16 and an end portion of the first core resin 33 are spaced apart with the interval 28 of 50 μm or more (see FIGS. 7A and 7C).

A method for producing the electronic component according to this embodiment is different from the method for producing the electronic component according to the first embodiment in the following points.

A photosensitive polyimide film is provided above the semiconductor substrate 11 having the electrode pad 12 and the passivation film 13, and is exposed and developed. Thus, a resin layer constituted by the polyimide film is formed on the passivation film 13. Then, the first core resin 33 is formed above the semiconductor substrate 11 as shown in FIG. 7B by curing this resin layer. The first core resin 33 has a nearly semi-elliptical cross section.

Next, a photosensitive polyimide film is provided on the entire surface including the first core resin 33, and is exposed and developed. Thus, a resin layer constituted by the polyimide film is formed on the first core resin 33. Then, the third core resin 16 is formed on the first core resin 33 as shown in FIG. 7B by curing this resin layer. In this manner, the resin projection 17a including the first and third core resins 33 and 16 is formed.

The subsequent step of forming the TiW layer 22 and the following steps are the same as those of the first embodiment.

This embodiment can also provide the same effects as those of the first embodiment.

Fourth Embodiment

Figure 8A:
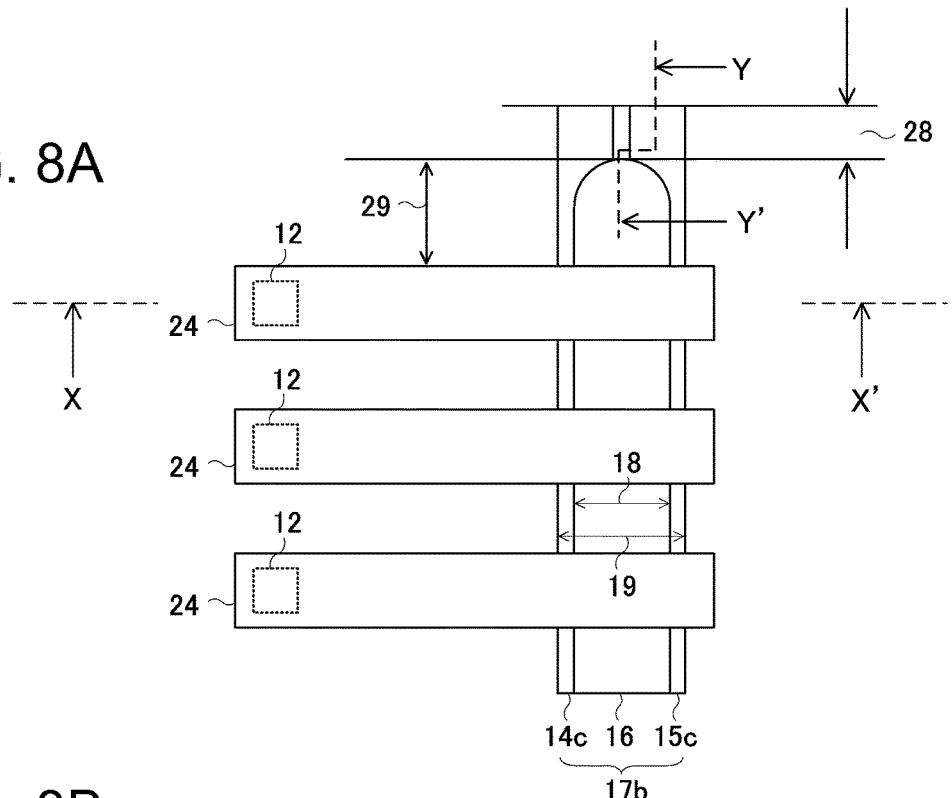
FIG. 8A is a plan view of an electronic component according to an aspect of the invention.
Figure 8B:
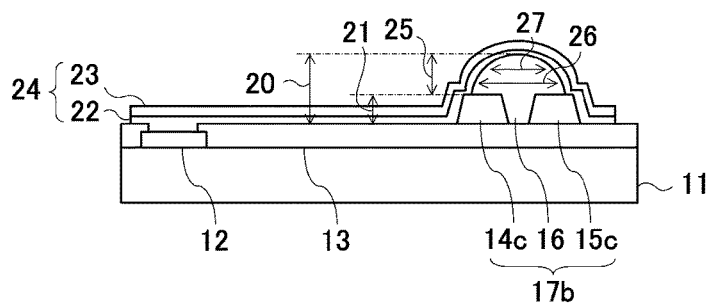
FIG. 8B is a cross-sectional view taken along line X-X' in FIG. 8A.
Figure 8C:
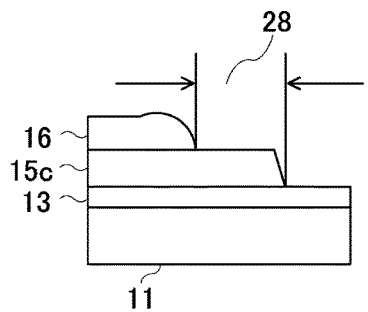
FIG. 8C is a cross-sectional view taken along line Y-Y' in FIG. 8A.

FIGS. 8A to 8C are plan views illustrating an electronic component according to an aspect of the invention. The same portions as those shown in FIGS. 1A to 1C are denoted by the same reference numerals, and different portions will be described.

The first and second core resins 14 and 15 shown in FIGS. 1A and 1B are each formed so as to have a nearly semicircular cross section, whereas, in this embodiment, as shown in FIG. 8B, first and second core resins 14c and 15c in a resin projection 17b are each formed so as to have a nearly quadrangular cross section, specifically, a trapezoidal cross section.

This embodiment can also provide the same effects as those of the first embodiment.

Fifth Embodiment

Figure 9A:
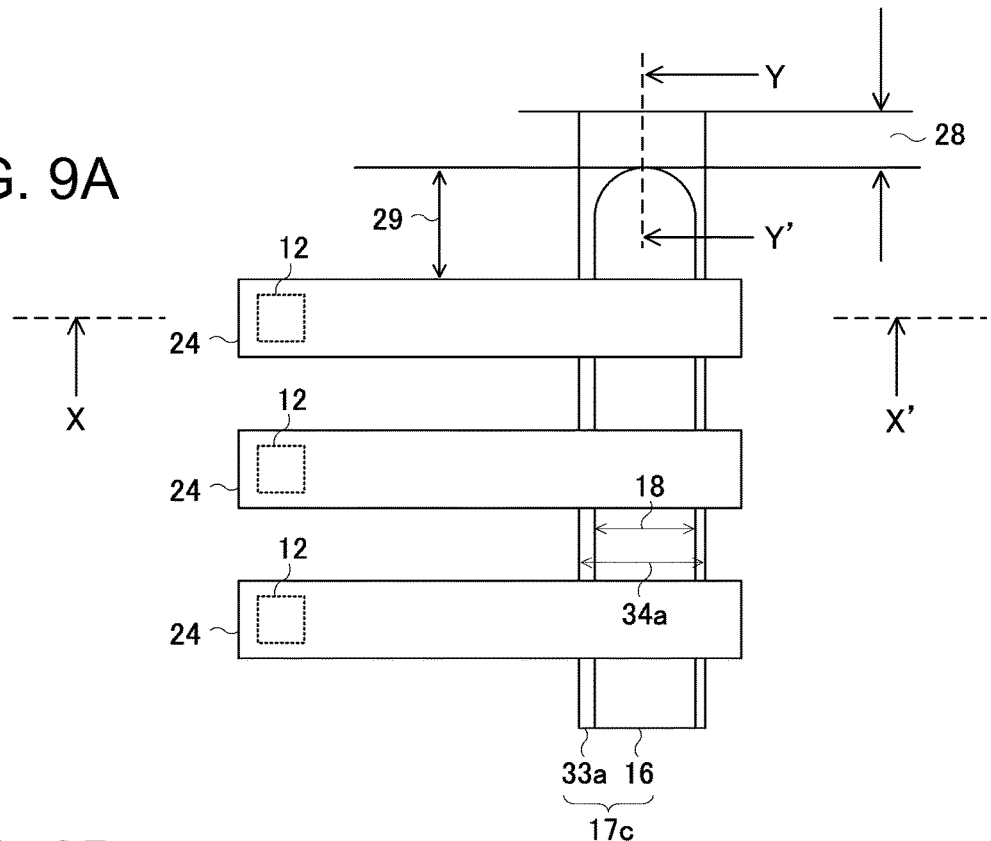
FIG. 9A is a plan view of an electronic component according to an aspect of the invention.
Figure 9B:
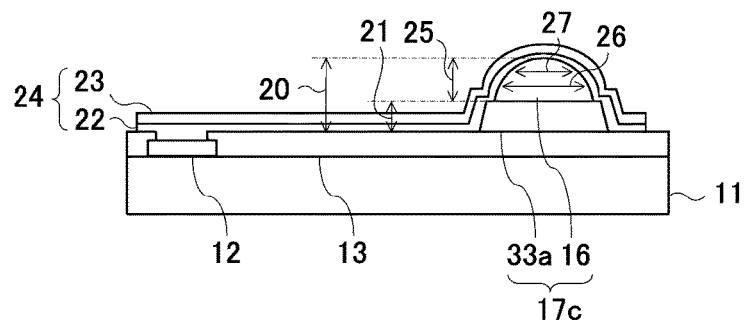
FIG. 9B is a cross-sectional view taken along line X-X' in FIG. 9A.
Figure 9C:
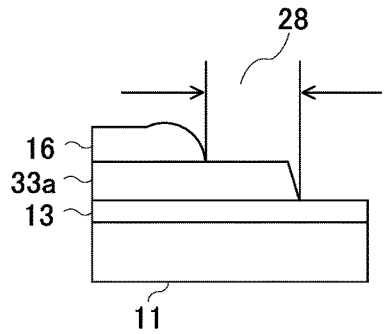
FIG. 9C is a cross-sectional view taken along line Y-Y' in FIG. 9A.

FIGS. 9A to 9C are plan views illustrating an electronic component according to an aspect of the invention. The same portions as those shown in FIGS. 7A to 7C are denoted by the same reference numerals, and different portions will be described.

A first core resin (also referred to as "first resin layer") 33a is formed on the passivation film 13. The first core resin 33a has a nearly quadrangular cross section, specifically, a trapezoidal cross section, as shown in FIG. 9B.

The third core resin 16 is formed on the first core resin 33a. A resin projection 17c including the first and third core resins 33a and 16 is formed in this manner.

A width 34a of the first core resin 33a is larger than the width 18 of the third core resin 16 (see FIG. 9A). This makes it possible to make steps generated by the resin projection 17c smaller.

This embodiment can also provide the same effects as those of the third embodiment.

Sixth Embodiment

Figure 10A:
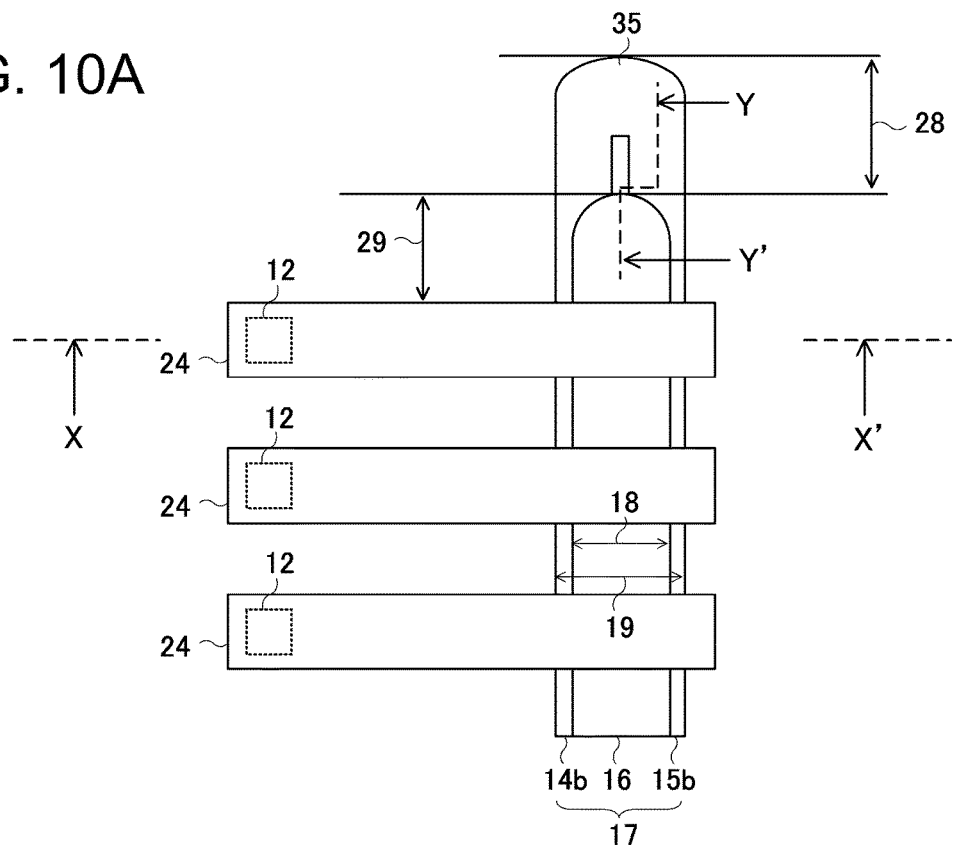
FIG. 10A is a plan view of an electronic component according to an aspect of the invention.
Figure 10B:
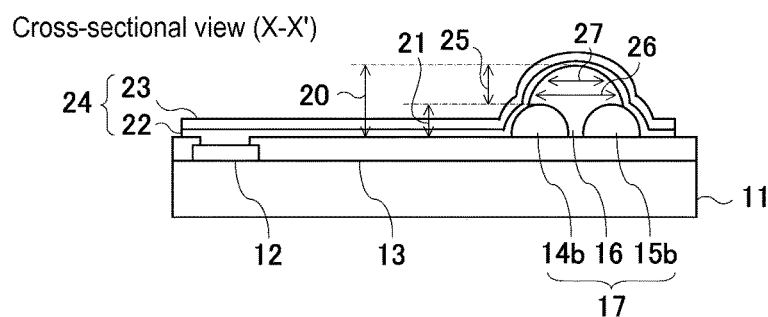
FIG. 10B is a cross-sectional view taken along line X-X' in FIG. 10A.
Figure 10C:
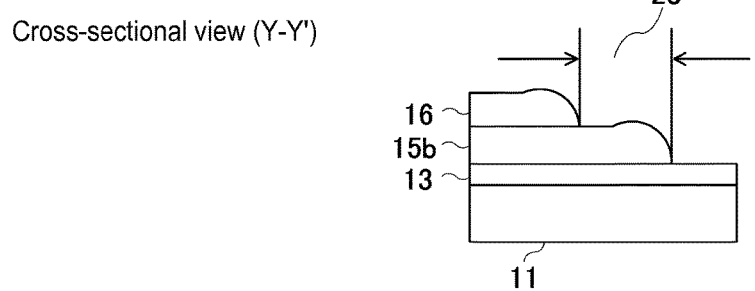
FIG. 10C is a cross-sectional view taken along line Y-Y' in FIG. 10A.

FIGS. 10A to 10C are plan views illustrating an electronic component according to an aspect of the invention. The same portions as those shown in FIGS. 1A to 1C are denoted by the same reference numerals, and different portions will be described.

The first core resin 14 and the second core resin 15, which are formed in a linear shape shown in FIGS. 1A and 1B, are disposed so as to be apart from each other and are not in contact with each other, whereas, in this embodiment, a first core resin 14b and a second core resin 15b are connected to each other at an end portion 35 as shown in FIG. 10A. It should be noted that as in the first embodiment, the portions of the first core resin 14b and the second core resin 15b other than this end portion 35 are disposed so as to be apart from each other.

This embodiment can also provide the same effects as those of the first embodiment.

In this embodiment, the first core resin 14b and the second core resin 15b are connected to each other at the end portion 35. Therefore, when a photosensitive polyimide film for forming the third core resin 16 is provided on the first and second core resins 14b and 15b, it is possible to lessen the chance of a case where the polyimide flows in the longitudinal direction of the first and second core resins 14b and 15b. This makes it possible to suppress a decrease in thickness of the end portion of the photosensitive polyimide film for forming the third core resin 16.

Seventh Embodiment

Figure 11A:
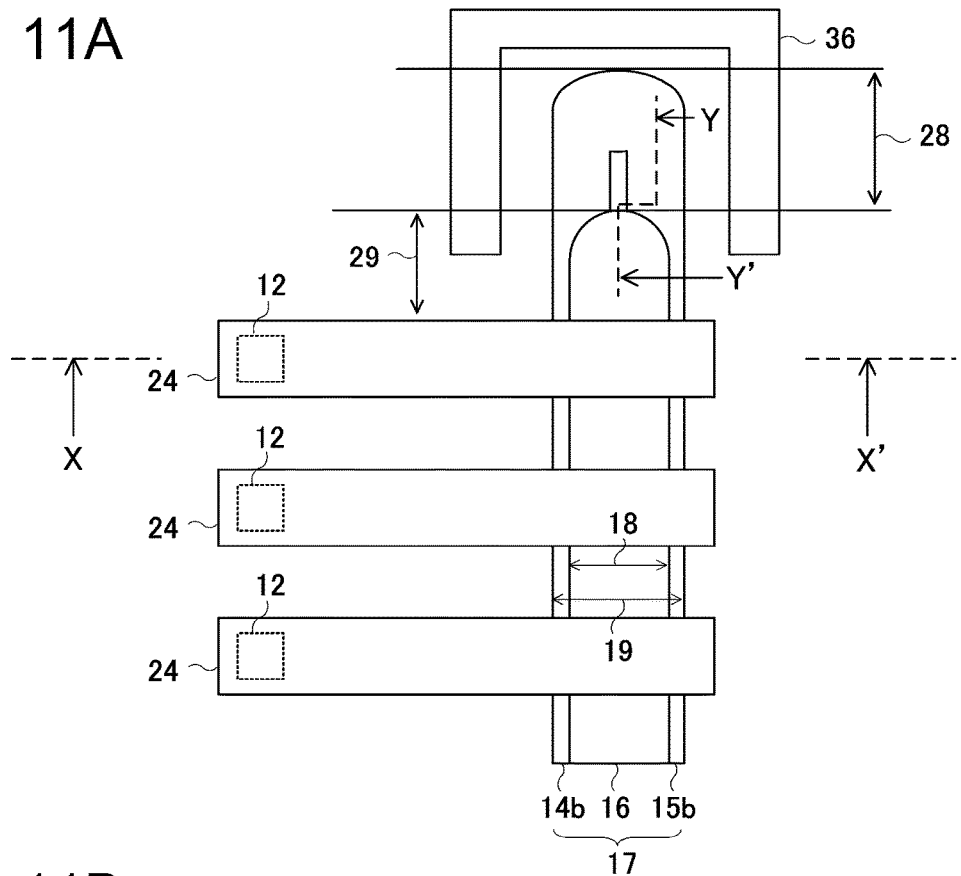
FIG. 11A is a plan view of an electronic component according to an aspect of the invention.
Figure 11B:
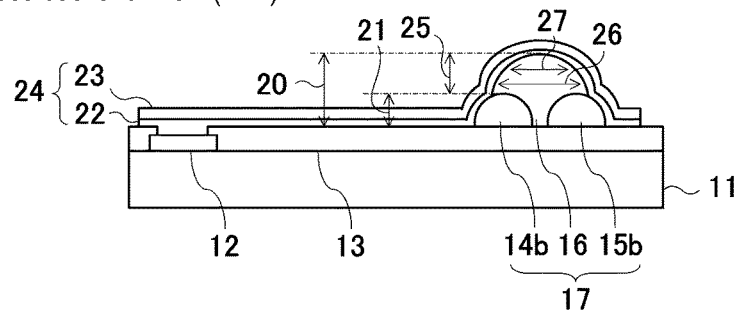
FIG. 11B is a cross-sectional view taken along line X-X' in FIG. 11A.
Figure 11C:
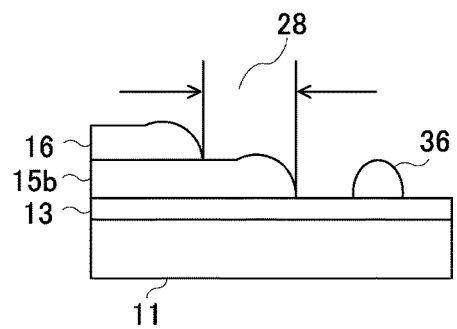
FIG. 11C is a cross-sectional view taken along line Y-Y' in FIG. 11A.
Figure 12A:
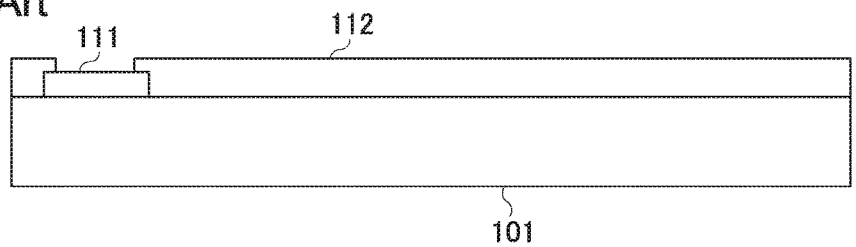
FIGS. 12A to 12D are cross-sectional views illustrating a method for producing an electronic component in related art.
Figure 12B:
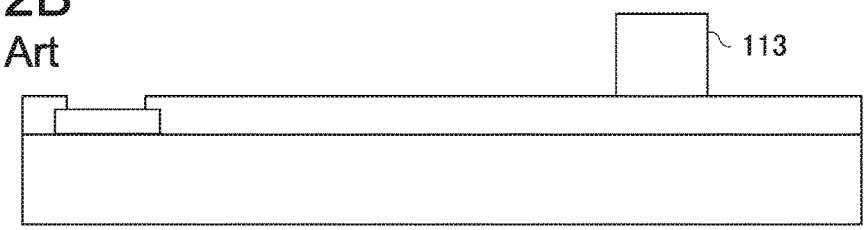
Figure 12C:
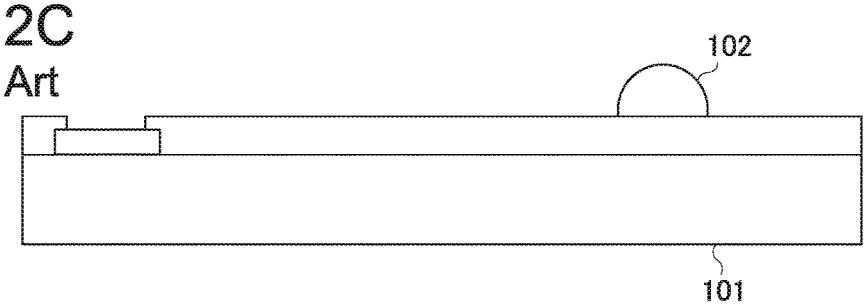
Figure 12D:
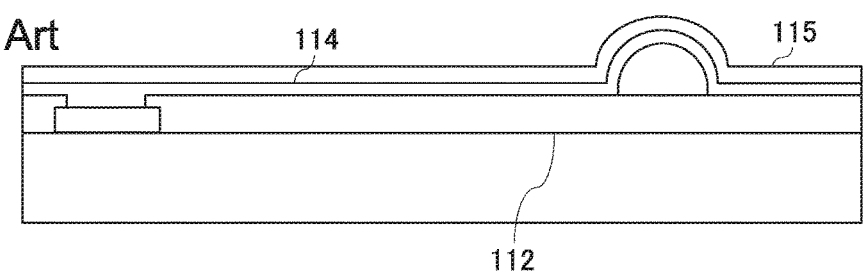
Figure 13A:
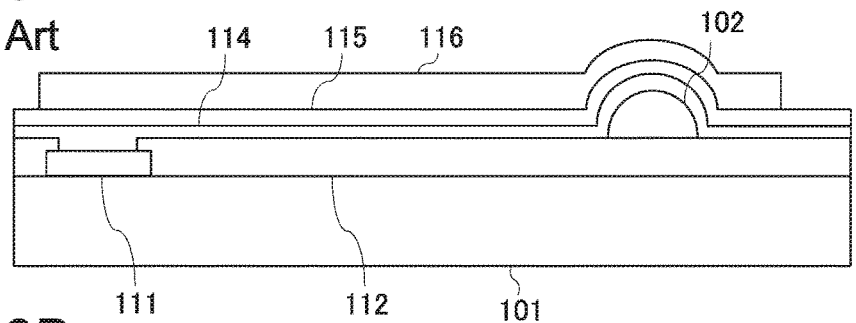
FIGS. 13A to 13D are cross-sectional views illustrating the method for producing an electronic component in related art.
Figure 13B:
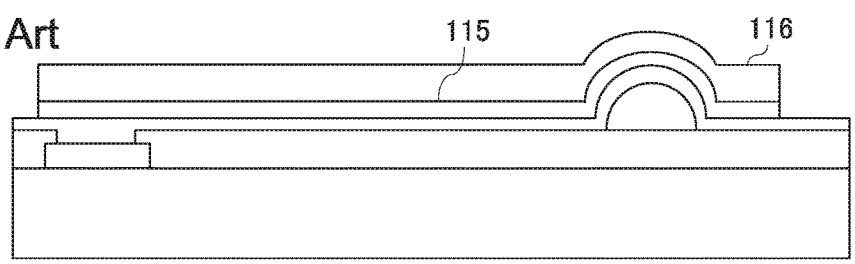
Figure 13C:
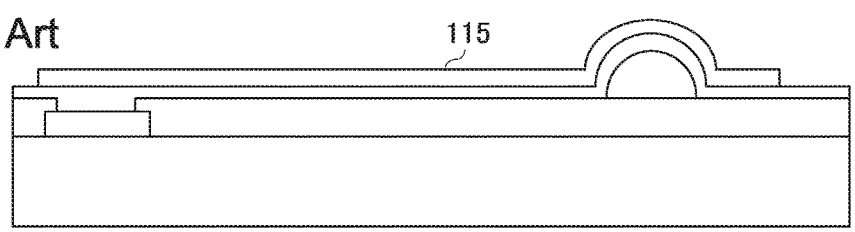
Figure 13D:
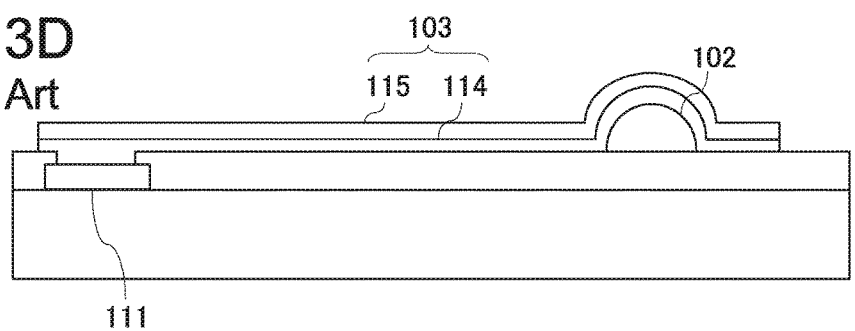
Figure 14:
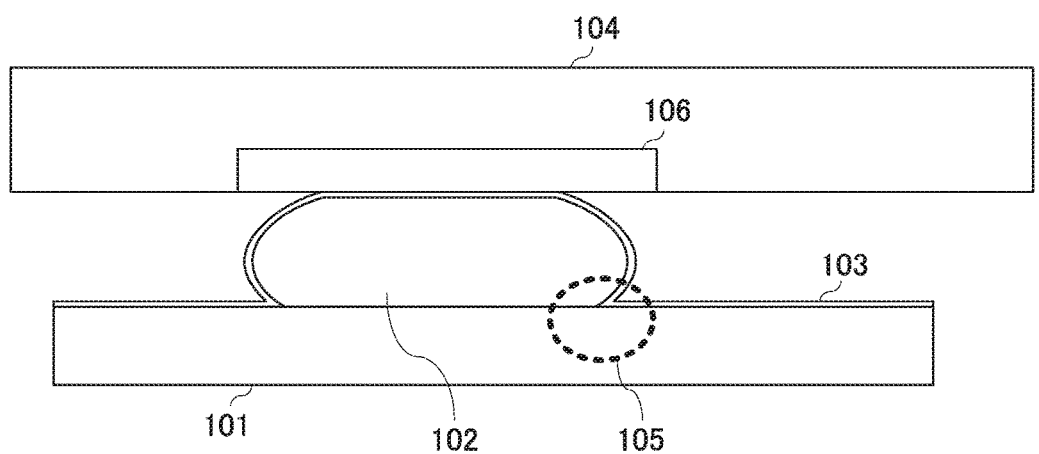
FIG. 14 is a cross-sectional view illustrating the method for producing an electronic component in related art.

FIGS. 11A to 11C are plan views illustrating an electronic component according to an aspect of the invention. The same portions as those shown in FIGS. 10A to 10C are denoted by the same reference numerals, and different portions will be described.

As shown in FIGS. 11A and 11B, a dam member 36 for surrounding the end portion of the first and second core resins 14b and 15b is formed on the passivation film 13. In other words, this dam member 36 surrounds the end portion of the first and second core resins 14b and 15b in three directions.

This embodiment can also provide the same effects as those of the sixth embodiment.

In this embodiment, the end portion of the first and second core resins 14b and 15b is surrounded by the dam member 36. Therefore, when a photosensitive polyimide film for forming the third core resin 16 is provided on the first and second core resins 14b and 15b, it is possible to lessen the chance of a case where the polyimide flows in the longitudinal direction of the first and second core resins 14b and 15b. This makes it possible to suppress a decrease in thickness of the end portion of the photosensitive polyimide film for forming the third core resin 16.

Although the end portion of the first and second core resins 14b and 15b in the sixth embodiment is surrounded by the dam member 36 in this embodiment, there is no limitation to this. For example, the dam member 36 can also surround the end portions of the core resins in any of the first to fifth embodiments.

It should be noted that in the invention, forming a specific component B (referred to as "B" hereinafter) on (or under) a specific component A (referred to as "A" hereinafter) is not limited to cases where B is formed directly on (or under) A. Cases where B is formed on (or under) A via another component without impeding the effects of the invention may also be included therein.

The first to seventh embodiments can also be implemented in combination as appropriate.

The entire disclosure of Japanese Patent Application No. 2014-238028, filed Nov. 25, 2014 is expressly incorporated by reference herein.

What is claimed is:

1. An electronic component comprising:
a substrate that has an electrode;
a first resin layer that is located above the substrate;
a second resin layer, at least a portion of the second resin layer being located on top of the first resin layer such that a portion of the first resin layer is sandwiched between the portion of the second resin layer and the substrate;
a resin projection that includes the first and second resin layers and is higher than the first resin layer;
a conductive layer that is electrically connected to the electrode and lies above the resin projection; and
a third resin layer that is located above the substrate and next to the first resin layer,
wherein at least a portion of the second resin layer is located on the third resin layer, and
the resin projection includes the third resin layer and is higher than the third resin layer.

2. The electronic component according to claim 1, wherein the first resin layer has a same width as that of the third resin layer.

3. The electronic component according to claim 1, wherein a length from a side portion of the first resin layer to a side portion of the third resin layer located under the conductive layer is larger than a width of the second resin layer located under the conductive layer.

4. The electronic component according to claim 1, further comprising:
an insulating layer that is located between the substrate and the first and third resin layers and is in contact with the first and third resin layers,
wherein a portion of the second resin layer that is located between the first resin layer and the third resin layer is in contact with the insulating layer.

5. The electronic component according to claim 1, wherein a height of the second resin layer from a highest portion of the first resin layer is larger than a height of the first resin layer.

6. The electronic component according to claim 1, wherein the substrate has a plurality of the electrodes,
a plurality of the conductive layers lie above the resin projection, and
the plurality of conductive layers are electrically connected to the plurality of electrodes, respectively.

7. The electronic component according to claim 1, wherein the substrate is a semiconductor substrate.

8. The electronic component according to claim 1, wherein the conductive layer on the resin projection is to be joined to an electrode of a mounting substrate.

* * * * *